United States Patent
Singhal

(10) Patent No.: US 12,119,796 B2
(45) Date of Patent: Oct. 15, 2024

(54) RADIO-FREQUENCY POWER AMPLIFIER WITH INTERMODULATION DISTORTION MITIGATION

(71) Applicant: Apple Inc., Cupertino, CA (US)

(72) Inventor: Nitesh Singhal, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 471 days.

(21) Appl. No.: 17/539,977

(22) Filed: Dec. 1, 2021

(65) Prior Publication Data
US 2023/0170859 A1    Jun. 1, 2023

(51) Int. Cl.
*H03F 3/24* (2006.01)
*H04B 1/40* (2015.01)

(52) U.S. Cl.
CPC ............. *H03F 3/245* (2013.01); *H04B 1/40* (2013.01); *H03F 2200/451* (2013.01)

(58) Field of Classification Search
CPC .. H03F 3/245; H03F 2200/451; H03F 1/0266; H03F 2200/456; H03F 1/223; H03F 1/3205; H03F 1/3211; H03F 1/3223; H03F 3/45179; H03F 2200/06; H03F 2200/534; H03F 3/213; H03F 3/195; H03F 3/189; H04B 1/40
USPC .................. 330/250, 252–261, 311
See application file for complete search history.

(56) References Cited

U.S. PATENT DOCUMENTS

| | | | |
|---|---|---|---|
| 3,895,306 A * | 7/1975 | Rebeles | H03F 3/26 330/271 |
| 6,794,938 B2 | 9/2004 | Weldon | |
| 6,856,796 B2 | 2/2005 | Ping et al. | |
| 7,005,919 B2 * | 2/2006 | Petrovic | H03F 3/45475 330/149 |
| 8,165,553 B2 | 4/2012 | Lou et al. | |

(Continued)

FOREIGN PATENT DOCUMENTS

| | | |
|---|---|---|
| CN | 110635769 A | 12/2019 |
| CN | 113328710 A | 8/2021 |

OTHER PUBLICATIONS

Ziu-Hao Wang et al., "A 28-GHz High Linearity Up-Conversion Mixer Using Second-Harmonic Injection Technique in 28-nm CMOS Technology", IEEE Microwave and Wireless Components Letters, Mar. 2021, p. 276-279, vol. 31, No. 3. IEEE, New York, NY.

*Primary Examiner* — Hieu P Nguyen
(74) *Attorney, Agent, or Firm* — Treyz Law Group; Jason Tsai

(57) ABSTRACT

An electronic device may include wireless circuitry with a processor, a transceiver, an antenna, and a front-end module coupled between the transceiver and the antenna. The front-end module may include one or more power amplifiers for amplifying a signal for transmission through the antenna. Radio-frequency power amplifier circuitry may include an amplifier, an input transformer for coupling radio-frequency input signals to the amplifier, an active inductor load coupled to the input transformer, and a second order intermodulation generation circuit configured to generate and inject a second order intermodulation product into the input transformer. The injected second order intermodulation product can be used to cancel out unwanted third order intermodulation products generated by the amplifier, which reduces intermodulation distortion experienced by the amplifier circuitry.

20 Claims, 9 Drawing Sheets

(56) References Cited

U.S. PATENT DOCUMENTS 10,447,209 B2 * 10/2019 Wang .................. H03F 3/211
2020/0028469 A1    1/2020 Chang et al.

* cited by examiner

RADIO-FREQUENCY POWER AMPLIFIER WITH INTERMODULATION DISTORTION MITIGATION

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Radio-frequency signals transmitted by an antenna are often fed through one or more power amplifiers, which are configured to amplify low power analog signals to higher power signals more suitable for transmission through the air over long distances. It can be challenging to design a satisfactory power amplifier for an electronic device.

SUMMARY

An electronic device may include wireless communications circuitry. The wireless communications circuitry may include one or more processors for generating digital signals, a transceiver for receiving the digital signals and for generating corresponding radio-frequency signals, and one or more radio-frequency power amplifiers configured to amplify the radio-frequency signals for transmission by one or more antenna in the electronic device. A power amplifier may exhibit third order non-linearity resulting in third order intermodulation products that can distort the radio-frequency signals during amplification.

An aspect of the disclosure provides radio-frequency amplifier circuitry that includes: a first input transistor having a first source-drain terminal coupled to a ground power supply line, a second source-drain terminal coupled to a first amplifier output terminal, and a gate terminal; a second input transistor having a first source-drain terminal coupled to the ground power supply line, a second source-drain terminal coupled to a second amplifier output terminal, and a gate terminal; an input transformer configured to receive a radio-frequency signal and coupled to the gate terminals of the first and second input transistors; and a second order intermodulation generation circuit having an output coupled to the input transformer. The second order intermodulation generation circuit can be configured to generate second order intermodulation signals that are used to generate third order intermodulation cancelling signals that cancel or reduce the third order intermodulation products.

The input transformer can include a primary inductor having first and second terminals configured to receive the radio-frequency signal and a secondary inductor having a first terminal coupled to the gate terminal of the first input transistor and having a second terminal coupled to the gate terminal of the second input transistor. The radio-frequency power amplifier circuitry can further include an active inductor load circuit coupled to a center tap of the secondary inductor.

In one arrangement, the second order intermodulation generation circuit can include: a first n-type transistor having a first source-drain terminal coupled to the gate terminal of the first input transistor, a second source-drain terminal coupled to a positive power supply line, and a gate terminal configured to receive a bias voltage; and a second n-type transistor having a first source-drain terminal coupled to the gate terminal of the second input transistor, a second source-drain terminal coupled to the positive power supply line, and a gate terminal configured to receive the bias voltage.

In another arrangement, the second order intermodulation generation circuit can include: a first p-type transistor having a first source-drain terminal coupled to a center tap of the secondary inductor, a second source-drain terminal coupled to a positive power supply line, and a gate terminal configured to receive a bias voltage via a first bias resistor; a second p-type transistor having a first source-drain terminal coupled to the center tap of the secondary inductor, a second source-drain terminal coupled to the positive power supply line, and a gate terminal configured to receive the bias voltage via a second bias resistor; a first capacitor having a first terminal coupled to the gate terminal of the first p-type transistor and having a second terminal coupled to the first terminal of the primary inductor; and a second capacitor having a first terminal coupled to the gate terminal of the second p-type transistor and having a second terminal coupled to the second terminal of the primary inductor.

An aspect of the disclosure provides a method of operating wireless circuitry. The method can include: receiving a radio-frequency signal at an input transformer; receiving, at an amplifier, the radio-frequency signal from the input transformer; generating a second order intermodulation signal using a second order intermodulation generation circuit and coupling the second order intermodulation signal to the input transformer; and combining the second order intermodulation signal with the radio-frequency signal to generate corresponding signals that cancel out third order intermodulation signals associated with the amplifier. The method can include converting the second order intermodulation signal from a current signal to a voltage signal using an active inductor load circuit coupled to the input transformer.

In one process, the method can include using a first n-type transistor having a source terminal coupled to a gate terminal of the first input transistor to output a second order intermodulation current through a secondary inductor in the input transformer while using a second n-type transistor having a source terminal coupled to a gate terminal of the second input transistor to output the second order intermodulation current through the secondary inductor in the input transformer. In another process, the method can include using a first p-type transistor to output a second order intermodulation current to a center tap of the secondary inductor while using a second p-type transistor to output the second order intermodulation current to the center tap of the secondary inductor.

DETAILED DESCRIPTION

An electronic device may be provided with wireless transmitter circuitry. The wireless transmitter circuitry may include a transmitter circuit for outputting a transmit signal, a radio-frequency power amplifier for amplifying the transmit signal, and an antenna for radiating the amplified signal. In practice, a radio-frequency power amplifier may exhibit non-linear behavior resulting in intermodulation distortion such as third order intermodulation distortion.

To mitigate third order intermodulation distortion, the radio-frequency power amplifier may be provided with a second order intermodulation generation circuit configured to generate and inject a second order intermodulation signal at the input of the radio-frequency power amplifier. The injected second order intermodulation signal can mix with input signals at the input of the radio-frequency power amplifier to generate corresponding products that cancel out the undesired third order intermodulation tones. The present embodiments describe various implementations of a second order intermodulation generation, injection and mixing circuits which can be used to improve the linearity of the radio-frequency power amplifier to preserve the fidelity of the transmitted signal without degrading the overall efficiency of the power amplifier.

Figure 1:
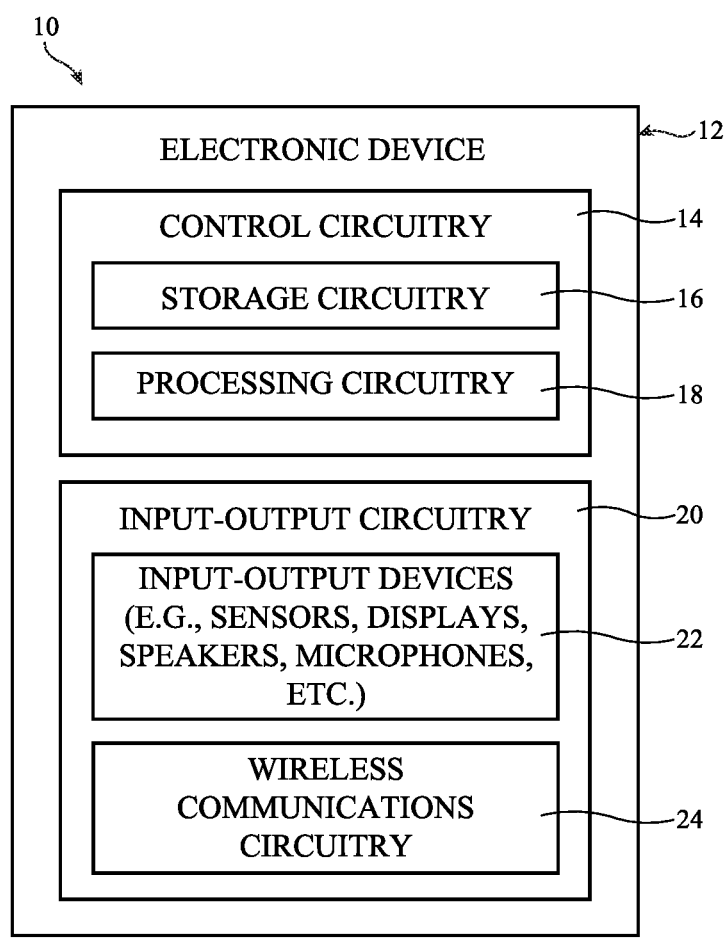
FIG. 1 is a diagram of an illustrative electronic device having wireless communications circuitry in accordance with some embodiments.

FIG. 1 is a diagram of an electronic device such as electronic device 10 that can be provided with such wireless transmitter circuitry. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application processors, application specific integrated circuits, central processing units (CPUs), general purpose processors, or other types of processors. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultrawideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless communications circuitry such as wireless communications circuitry 24 (sometimes referred to herein as wireless circuitry 24) for wirelessly conveying radio-frequency signals. While control circuitry 14 is shown separately from wireless communications circuitry 24 for the sake of clarity, wireless communications circuitry 24 may include processing circuitry that forms a part of processing circuitry 18 and/or storage circuitry that forms a part of storage circuitry 16 of control circuitry 14 (e.g., portions of control circuitry 14 may be implemented on wireless communications circuitry 24). As an example, control circuitry 14 (e.g., processing circuitry 18) may include processor circuitry or other control components that form a part of wireless communications circuitry 24.

Wireless communications circuitry 24 may include radio-frequency (RF) transceiver circuitry formed from one or more integrated circuits, power amplifier circuitry configured to amplify uplink radio-frequency signals (e.g., radio-frequency signals transmitted by device 10 to an external device), low-noise amplifiers configured to amplify downlink radio-frequency signals (e.g., radio-frequency signals received by device 10 from an external device), passive radio-frequency components, one or more antennas, transmission lines, and other circuitry for handling radio-frequency wireless signals. Wireless signals can also be sent using light (e.g., using infrared communications).

Wireless circuitry 24 may include radio-frequency transceiver circuitry for handling transmission and/or reception of radio-frequency signals in various radio-frequency communications bands. For example, the radio-frequency transceiver circuitry may handle wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled by such radio-frequency transceiver circuitry may sometimes be referred to herein as frequency bands or simply as "bands," and may span corresponding ranges of frequencies. In general, the radio-frequency transceiver circuitry within wireless circuitry 24 may cover (handle) any desired frequency bands of interest.

Figure 2:
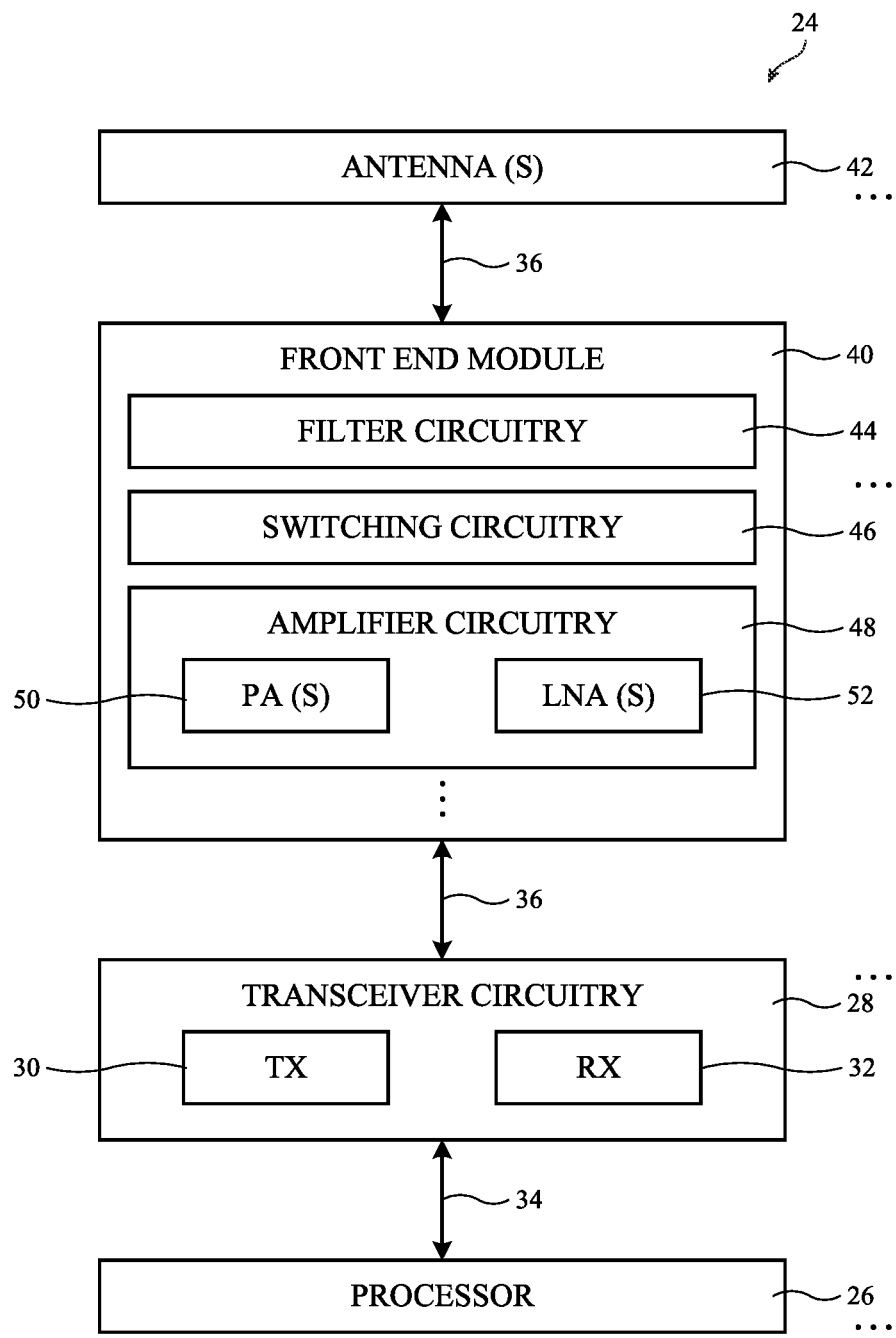
FIG. 2 is a diagram of illustrative wireless communications circuitry having amplifier circuitry in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio-frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

As described above, front end module 40 may include one or more power amplifiers (PA) circuits 50 in the transmit (uplink) path. A power amplifier 50 (sometimes referred to as radio-frequency power amplifier circuitry, transmit amplifier circuitry, or amplifier circuitry) may be configured to amplify a radio-frequency signal without changing the signal shape, format, or modulation. Power amplifier 50 may, for example, be used to provide 10 dB of gain, 20 dB of gain, 10-20 dB of gain, less than 20 dB of gain, more than 20 dB of gain, or other suitable amounts of gain.

It can be challenging to design a satisfactory radio-frequency power amplifier for an electronic device. Radio-frequency power amplifiers are non-linear circuits whose performance is oftentimes degraded due to intermodulation distortion. Intermodulation distortion arises when at least two signals at different frequencies are applied to a non-linear circuit and when the amplitude modulation or mixing (multiplication) of the two signals when their sum is raised to a power greater than one generates intermodulation products that are not just at harmonic frequencies (integer multiples) of either input signal but also at the sum and differences of the input signal frequencies and also at sums and differences of multiples of those frequencies.

Figure 3:
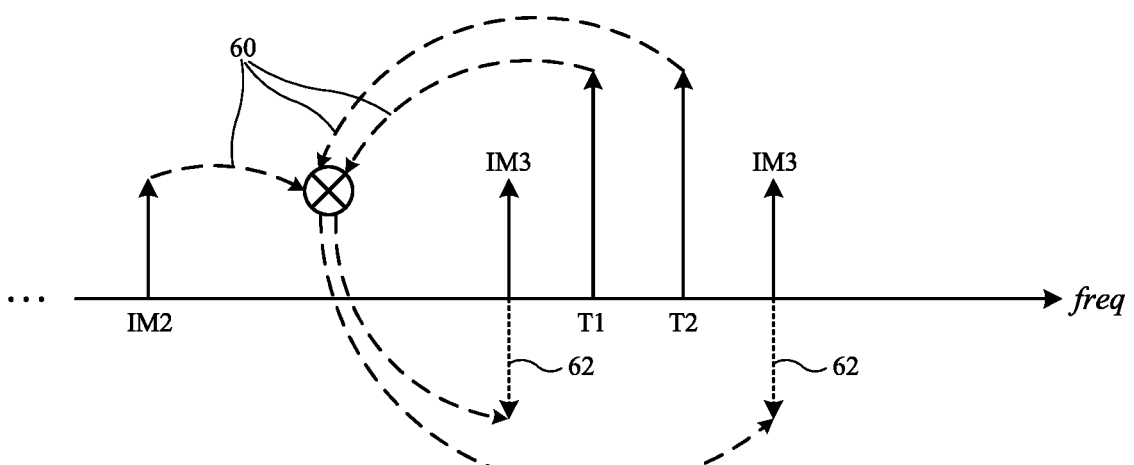
FIG. 3 is a diagram showing how mixing between a two tone signal and second order intermodulation (IM2) products can produce signals for cancelling unwanted third order intermodulation (IM3) products in accordance with some embodiments.

FIG. 3 is a diagram showing two input signals labeled as a first tone T1 and a second tone T2. The first tone T1 may be at angular frequency $\omega_1$ (i.e., equal to $2\pi f_1$), whereas the second tone T2 may be at angular frequency $\omega_2$ (i.e., equal to $2\pi f_2$). Angular frequency $\omega_2$ may be greater than $\omega_1$. Of particular interest are the third order intermodulation (IM3) products generated at $(2\omega_1-\omega_2)$ and $(2\omega_2-\omega_1)$. In particular, if the difference between $\omega^1$ and $\omega_2$ is relatively small, then the IM3 components generated at $(2\omega_1-\omega_2)$ and $(2\omega_2-\omega_1)$ will appear in the vicinity of $\omega_1$ and $\omega_2$, as shown in FIG. 3. The magnitude of these IM3 tones (see the third order tones appearing on either side of the two signal tones) directly contribute to third order intermodulation distortion (IMD3).

In accordance with an embodiment, the two signal tones T1 and T2 can be mixed with a second order intermodulation (IM2) product generated at angular frequency $(\omega_2-\omega_1)$, as shown by arrows 60 in FIG. 3, to generate corresponding products 62. This mixing can occur due to a second order non-linearity of the power amplifier. As shown in FIG. 3, products 62 can be used to destructively cancel the IM3 products and are therefore sometimes referred to as third order intermodulation (IM3) cancelling signals. Aspects of this disclosure describe circuitry and methods for generating such IM3 cancelling signal components for a radio-frequency power amplifier.

Figure 4:
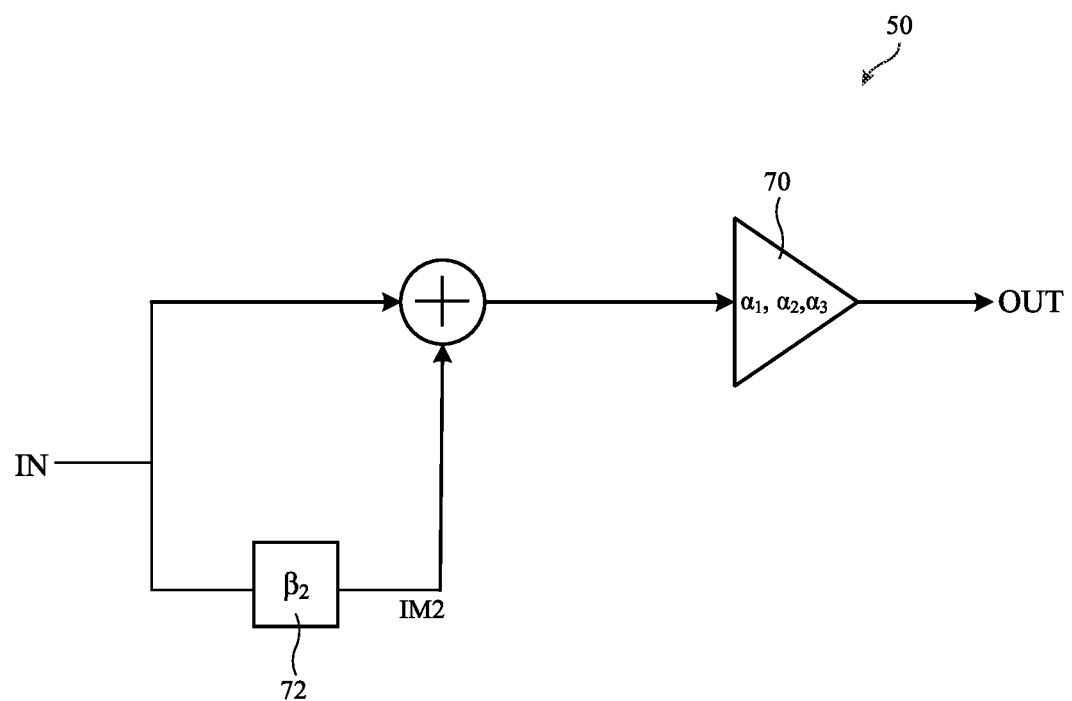
FIG. 4 is a block diagram of illustrative amplifier circuitry having a second order intermodulation (IM2) generation circuit that can be used to inject an IM2 signal at an input of a radio-frequency power amplifier in accordance with some embodiments.

FIG. 4 is a block diagram of illustrative amplifier circuitry 50 having a second order intermodulation (IM2) generation circuit 72 that can be used to inject an IM2 signal at an input of a radio-frequency power amplifier 70 in accordance with some embodiments. As shown in FIG. 4, circuitry 50 may have an input port IN, an output port OUT, and radio-frequency power amplifier 70 exhibiting at least a second order non-linearity quantified by coefficient $\alpha_2$ and a third order non-linearity quantified by coefficient $\alpha_3$. As an example, value $\alpha_2$ may be greater than zero, whereas value $\alpha_3$ may be less than zero.

Circuit 72 may be coupled to the input port IN and may exhibit at least a second order non-linearity quantified by coefficient $\beta_2$, which can be used to generate an IM2 product. The IM2 product generated by second order intermodulation generation circuit 72 can be injected to the input of power amplifier 70 (sometimes referred to as the main amplifier or core amplifier circuit) to ultimately generate IM3 cancelling components for reducing the IMD3 of the overall amplifier circuitry 50. For example, consider a scenario where the two input tones are represented by the following expression:

$$x(t) = A\cos(\omega_1 t) + A\cos(\omega_2 t) \tag{1}$$

The IM2 generation circuit 72 may be configured to generate a corresponding IM2 product represented by the following expression:

$$IM2 = \frac{\beta_2 A^2 \cos(\omega_2 - \omega_1)t}{2} \tag{2}$$

where $\beta_2$ is greater than zero (as an example). Combining the IM2 product shown by expression 2 with the input signal shown in expression 1, the presence of second and third order non-linearity associated with main amplifier 70 can generate an output signal at the output port represented by the following simplified expression:

$$y(t) = \alpha_1 In(t) + \alpha_2 In(t)^2 + \alpha_3 In(t)^3 = \tag{3}$$
$$\alpha_1 A\cos(\omega_1 t) + \alpha_1 A\cos(\omega_2 t) + \frac{\alpha_2 \beta_2 A^3 \cos(2\omega_2 - \omega_1)t}{2} +$$
$$\frac{\alpha_2 \beta_2 A^3 \cos(2\omega_1 - \omega_2)t}{2} + \frac{3}{4}\alpha_3 A^3 \cos(2\omega_2 - \omega_1)t + \frac{3}{4}\alpha_3 A^3 \cos(2\omega_1 - \omega_2)t$$

where In(t) is equal to x(t) shown in equation 1 plus IM2 shown in equation 2. Thus, the IM3 products (i.e., the terms associated with $\alpha_3$) can be canceled if $\beta_2$ is set according to the following expression:

$$\beta_2 = -\frac{3}{2}\left(\frac{\alpha_3}{\alpha_2}\right) \tag{4}$$

In other words, a deliberate injection of IM2 tones at the proper values can effectively cancel the undesired IM3 tones associated with amplifier 70.

Figure 5:
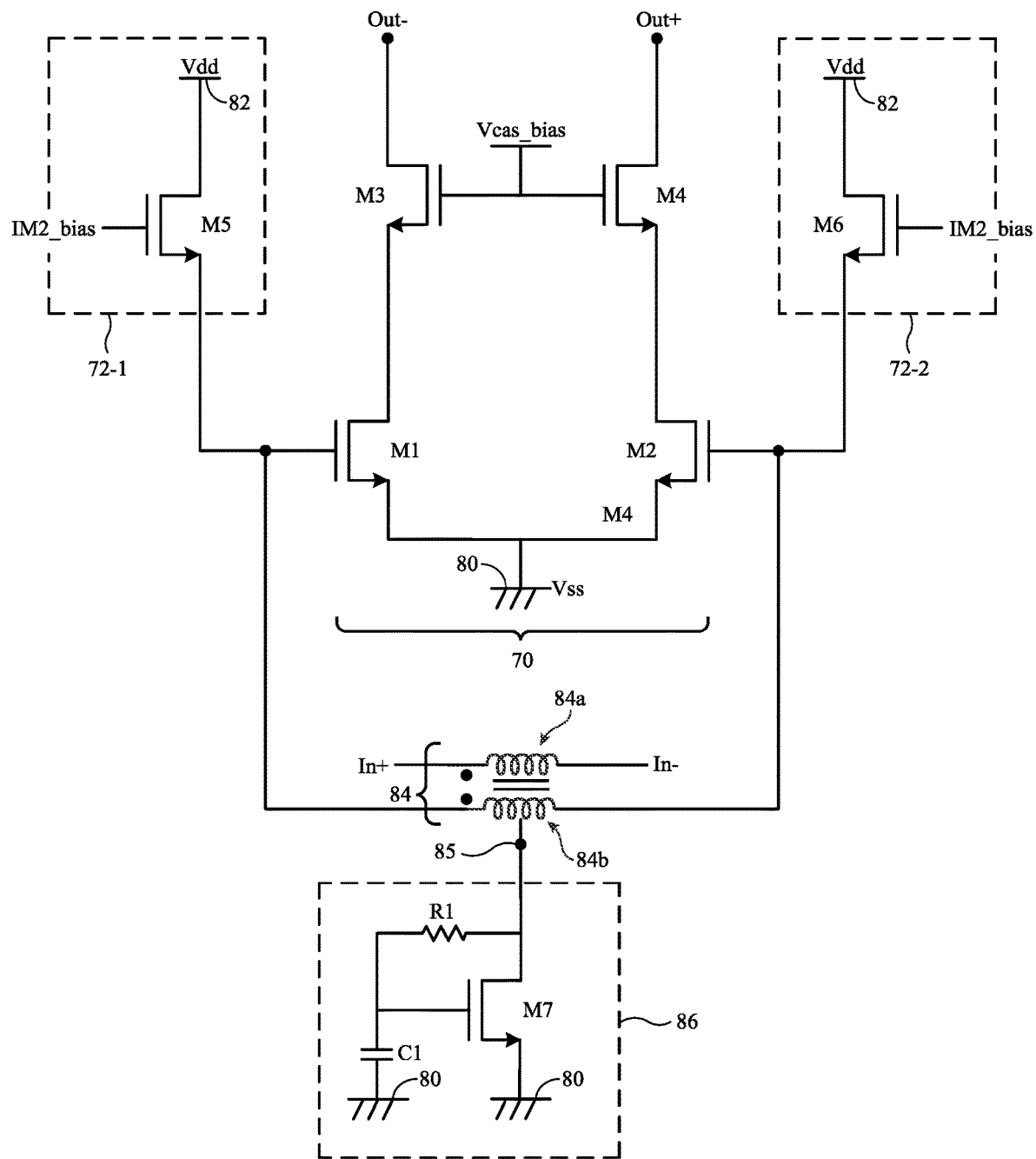
FIG. 5 is a circuit diagram of illustrative amplifier circuitry having an IM2 generation circuit and an active inductor load circuit in accordance with some embodiments.

FIG. 5 is a circuit diagram showing one illustrative implementation of amplifier circuitry 50. As shown in FIG. 5, circuitry 50 may include power amplifier 70 having transistors M1, M2, M3, and M4. Transistors M1-M4 may be n-type (n-channel) transistors such as n-type metal-oxide-semiconductor (NMOS) devices. Transistor M1 may have a source terminal coupled to a ground power supply line 80 (e.g., a ground line on which ground power supply voltage Vss is provided), a drain terminal, and a gate terminal coupled to a positive input terminal In+. Transistor M2 may have a source terminal coupled to ground power supply line 80, a drain terminal, and a gate terminal coupled to a negative input terminal In−. Input terminals In+ and In− serve collectively as the differential input port of circuitry 50, so transistors M1 and M2 are sometimes referred to as input transistors. The terms "source" and "drain" terminals used to refer to current-conveying terminals in a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa).

Transistor M3 may have a source terminal coupled to the drain terminal of input transistor M1, a gate terminal configured to receive a cascode bias voltage Vcas_bias, and a drain terminal coupled to a negative output terminal Out−. Transistor M4 may have a source terminal coupled to the drain terminal of input transistor M2, a gate terminal configured to receive cascode bias voltage Vcas_bias, and a drain terminal coupled to a positive output terminal Out+. Output terminals Out+ and Out−, sometimes referred to as power amplifier output terminals, serve collectively as the differential output port of circuitry 50. A shunt capacitor (not shown) may optionally be attached to the gate terminals of transistors M3 and M4. Bias voltage Vcas_bias may have some intermediate voltage level between ground voltage level Vss and a positive power supply voltage Vdd. If desired, voltage Vcas_bias may also be equal to positive power supply voltage Vdd.

Transistors M3 and M4 interposed between the drain terminals of the input transistors and the differential output port in this way are sometimes referred to collectively as cascode transistors. A cascode transistor (stage) can be defined as an amplifier stage with an amplifying transistor that has its gate terminal coupled to a common (fixed) voltage source (e.g., Vcas_bias). The cascode transistor stage with M3 and M4 may be used to increase the output impedance of power amplifier 70 and can optionally be used to provide different gain steps (e.g., by selectively adjusting the drive strength of transistors M3 and M4). The use of cascode transistors M3 and M4 are optional (e.g., the drain terminal of input transistor M1 can be directly connected to negative output terminal Out− without any intervening cascode transistor M3, and the drain terminal of input transistor M2 can be directly connected to positive output terminal Out+ without any intervening cascode transistor M4). In general, amplifier 70 can include more than four transistor or less than four transistors and can include other load components coupled to the input or output terminals of amplifier 70.

The gate terminals of input transistors M1 and M2 may be coupled to input terminals In+ and In− via an input transformer 84. Input transformer 84 may include a primary winding (inductor coil) 84a having a first terminal coupled to In+ and a second terminal coupled to In−. Input transformer 84 may also include a secondary winding (inductor coil) 84b having a first terminal coupled to the gate of input transistor M1, a second terminal coupled to the gate of input transistor M2, and a center tap coupled to a load circuit such as active inductor load circuit 86.

Active inductor load circuit 86 may include transistor M7, a resistor R1, and a capacitor C1. Transistor M7 may be an n-type transistor (e.g., an NMOS device) having a drain terminal coupled to the center tap of secondary winding 84b, a source terminal coupled to ground line 80, and a gate terminal. Transistor M7 is sometimes referred to as a load transistor. Resistor R1 may have a first terminal coupled to the drain terminal of transistor M7 and a second terminal coupled to the gate terminal of transistor M7. Capacitor C1 may have a first terminal coupled to the gate terminal of transistor M7 and a second terminal coupled to ground line 80. Configured in this way, load circuit 86 may behave and operate like an inductor to convert any current signal output from IM2 generation circuit 72 into a voltage signal. "Active" inductor load circuit 86, by definition, does not include any inductors. Using transistor M7, resistor R1, and capacitor C1 to collectively emulate an inductor can help save circuit area that would have otherwise been occupied by an inductor (which tend to be large components) and thus reduce cost. This is merely illustrative. Other ways of implementing an inductive load circuit can be used, if desired.

Second order intermodulation (IM2) generation circuit 72 may be coupled to the gate terminals of the input transistors M1 and M2. Circuit 72 may include a first sub-circuit 72-1 coupled to the gate terminal of input transistor M1 and a second sub-circuit 72-2 coupled to the gate terminal of input transistor M2. First sub-circuit 72-1 may be implemented as an n-type (channel) transistor M5 having a drain terminal coupled to positive power supply line 82 (e.g., a positive power supply terminal on which positive power supply voltage Vdd is provided), a source terminal coupled to the gate terminal of input transistor M1, and a gate terminal configured to receive a bias voltage IM2_bias. Second sub-circuit 72-2 may be implemented as an n-type (channel) transistor M6 having a drain terminal coupled to positive power supply line 82, a source terminal coupled to the gate terminal of input transistor M2, and a gate terminal configured to receive bias voltage IM2_bias.

Configured in this way, IM2 generation circuit 72 may produce an IM2 current signal that flows through secondary coil 84b of input transformer 84. The IM2 current signal can be converted into a voltage signal at node 85 using active inductor load 86. Node 85 where the IM2 signal is effectively injected into circuitry 50 and combined with the differential input signal received from input terminals In+ and In− can therefore sometimes be referred to as the IM2 signal injection node. As described above, a deliberate injection of IM2 tones at node 85 can cancel the unwanted IM3 tones generated by the power amplifier, which improves the overall linearity of circuitry 50 without degrading efficiency.

Figure 6:
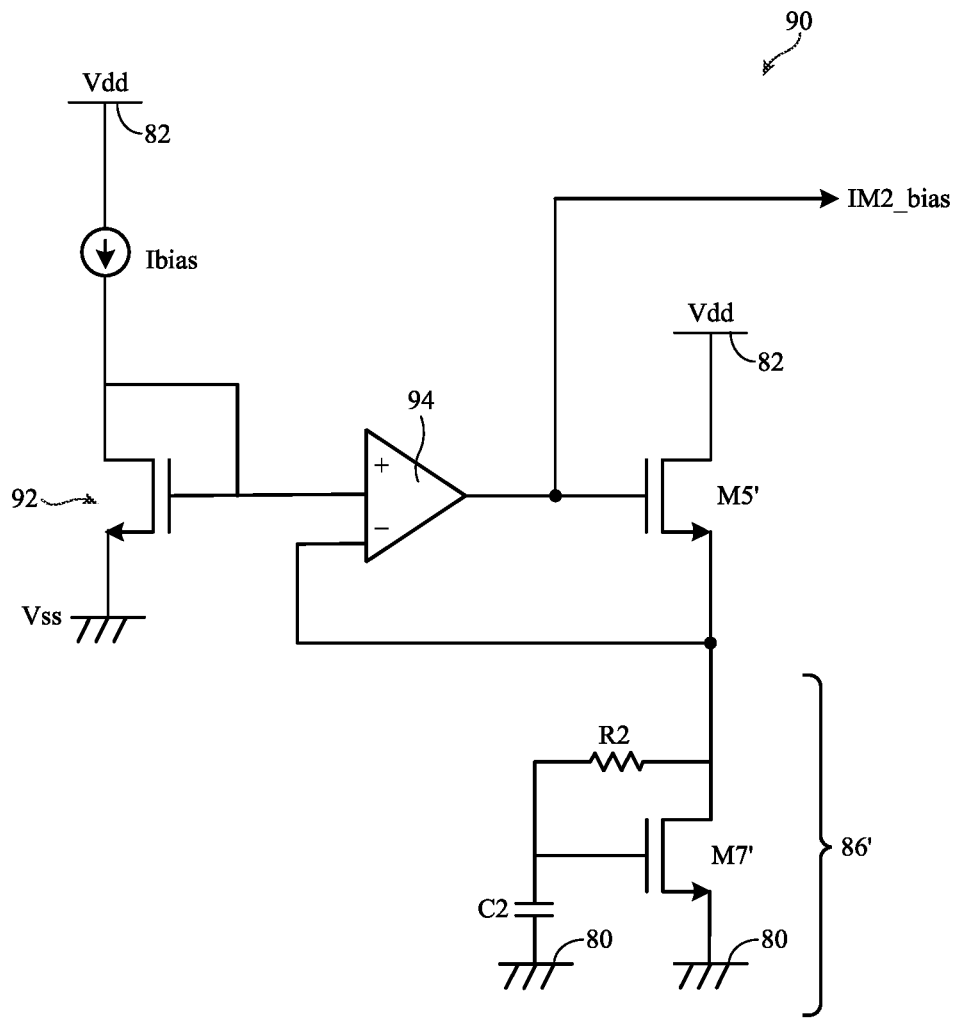
FIG. 6 is a circuit diagram of an illustrative bias voltage generation circuit in accordance with some embodiments.

Bias voltage IM2_bias may be generated using bias voltage generator 90 of the type shown in FIG. 6. As shown in FIG. 6, bias voltage generator 90 may include transistors M5', M7', and 92, an operational amplifier 94, a current source Ibias, resistor R2, and capacitor C2. Transistor 92 may be an n-type transistor having a source terminal coupled to the ground line, a gate terminal, and a drain terminal shorted to its gate terminal. Transistor 92 may be connected in series with the current source, which provides current Ibias that flows through transistor 92. Connected in this way, transistor 92 serves as a bias diode for providing a reference voltage to operational amplifier 94.

Operational amplifier 94 may have a positive (+) input terminal coupled to the gate of transistor 92, a negative (−) input terminal coupled to the source terminal of transistor M5', and an output terminal coupled to the gate terminal of transistor M5'. The drain terminal of transistor M5' is coupled to positive power supply line 82. Bias voltage IM2_bias may be generated at the output terminal of operational amplifier 94. Transistor M7' may be an n-type transistor (e.g., an NMOS device) having a drain terminal coupled to the source terminal of transistor M5', a source terminal coupled to ground line 80, and a gate terminal. Resistor R2 may have a first terminal coupled to the drain terminal of transistor M7' and a second terminal coupled to the gate terminal of transistor M7'. Capacitor C2 may have a first terminal coupled to the gate terminal of transistor M7' and a second terminal coupled to ground line 80. Transistor M7', resistor R2, and capacitor C2 may collectively serve as a replica active inductor load circuit 86' (e.g., an inductive circuit having similar or identical structure as active inductor load circuit 86 of FIG. 5).

Arranged in this way, transistor M5' may mirror IM2 current generation transistors M5 and M6, whereas active inductor load circuit 86' may mirror active inductor load circuit 86. If desired, the size of the components within bias voltage generator 90 may be scaled down to help save power. For example, the size of replica transistor M5' may be equal to two times the size of transistor M5 divided by k, while the size of transistor M7' may be equal to the size of transistor M7 divided by k and while the size of resistor R2 may be equal to the size of resistor R1 multiplied by k. In general, k can be equal to 1, 2, 3, 4, 5, one to ten, greater than ten, or other integer/rational values. Bias voltage generator 90 of the type shown in FIG. 6 is merely illustrative. If desired, other types of bias voltage generator or regulator can be used to output voltage IM2_bias for properly biasing IM2 generation circuit 72.

Figure 7:
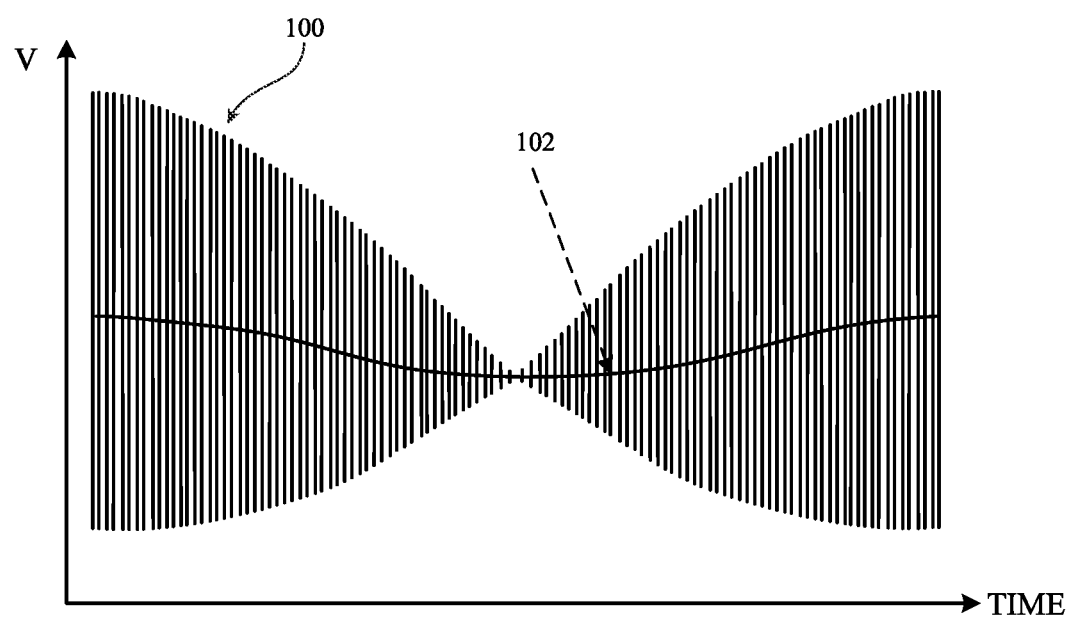
FIG. 7 is a timing diagram showing an amplifier bias point that varies with the envelope of a radio-frequency power amplifier input signal in accordance with some embodiments.

FIG. 7 is a timing diagram illustrating a two tone excitation of circuitry 50. Signal waveform 100 represents the radio-frequency input signal (with modulated IM2 signal injected), whereas signal waveform 102 represents a running average value of the bias voltage at the gate of the input transistors M1 and M2. As shown in FIG. 7, the gate bias voltage waveform 102 varies as a function of time and tracks the envelope of the modulated input signal waveform 102. In other words, the gate bias voltage changes with the power of the input signal when an IM2 current is injected into the radio-frequency power amplifier (i.e., the voltage at IM2 signal injection node 85 as shown in FIG. 5 follows the envelope variations of the modulated signal). Operated in this way, circuit 72 and injection node 85 should have adequate bandwidth to follow the envelope variations of the modulated signal. The use of active inductor load circuit 86 of the type shown in FIG. 5 can help improve the bandwidth of the envelope. Moreover, any phase shift of the injection envelope with respect to the signal envelope should be small over the envelope bandwidth.

Figure 8:
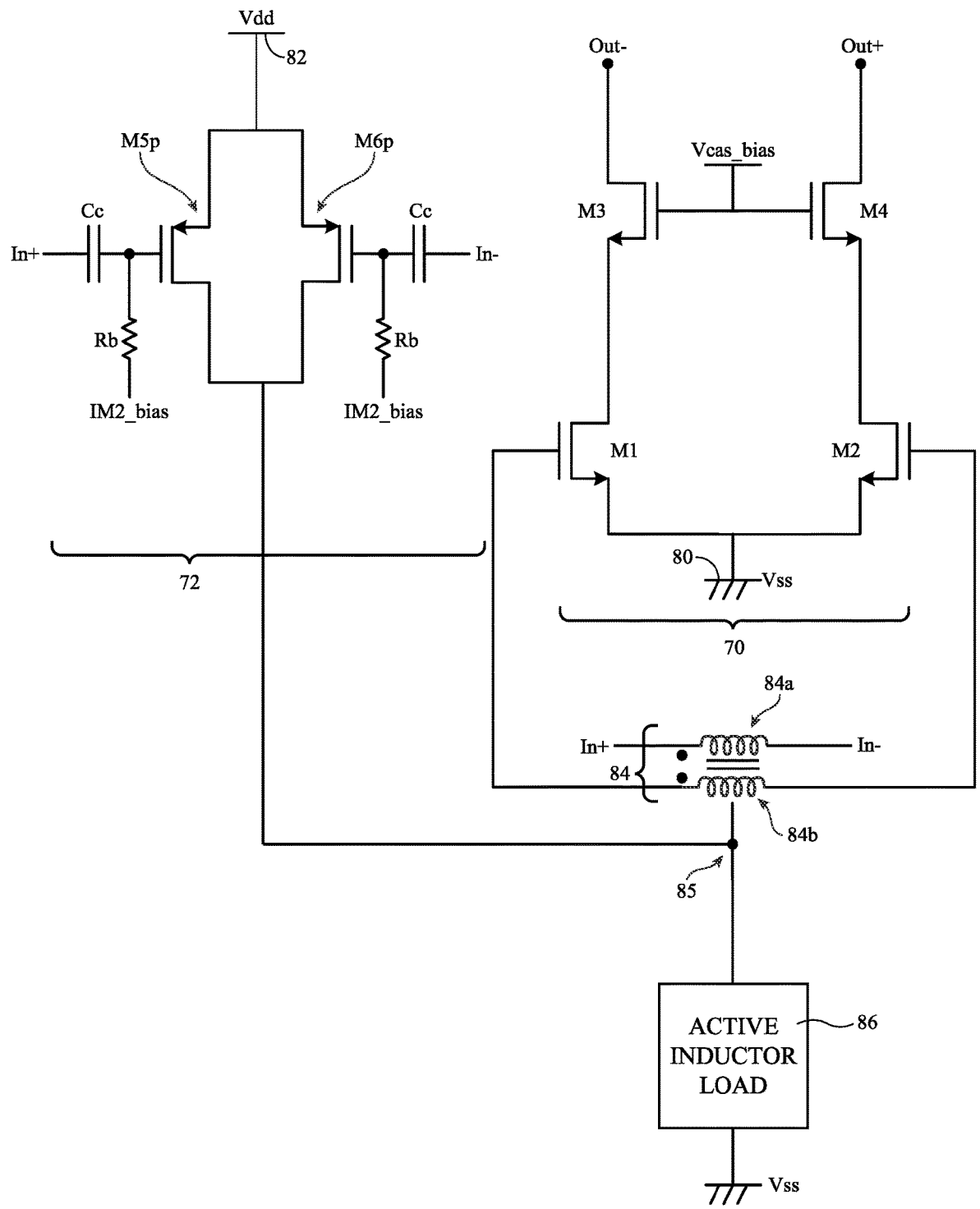
FIG. 8 is a circuit diagram of illustrative radio-frequency power amplifier circuitry having an IM2 generation circuit implemented using p-type transistors in accordance with some embodiments.

The embodiment of FIG. 5 in which IM2 signal generation circuit 72 is implemented using n-type (n-channel) transistors M5 and M6 is merely illustrative. FIG. 8 illustrates another embodiment of circuitry 50 in which IM2 generation circuit 72 is implemented using p-type (p-channel) transistors M5p and M6p. As shown in FIG. 8, circuitry 50 may include power amplifier 70 coupled to active inductor load 86 and to IM2 signal generation circuit 72. The structure and function of amplifier 70 is similar to that already described in connection with FIG. 5 and need not be reiterated in detail to avoid obscuring the present embodiment.

The gate terminals of input transistors M1 and M2 may be coupled to input terminals In+ and In− via input transformer 84. Input transformer 84 may include a primary winding (inductor coil) 84a having a first terminal coupled to In+ and a second terminal coupled to In−. Input transformer 84 may also include a secondary winding (inductor coil) 84b having a first terminal coupled to the gate of input transistor M1, a second terminal coupled to the gate of input transistor M2, and a center tap coupled to a load circuit such as active inductor load circuit 86. The structure and function of active inductor load 86 is similar to that already described in connection with FIG. 5 and need not be reiterated in detail to avoid obscuring the present embodiment.

Second order intermodulation (IM2) generation circuit 72 may be coupled to IM2 injection node 85, which is also coupled to the center tap of secondary winding 84b in transformer 84. Circuit 72 may include transistors p-type transistors M5p and M6p, bias resistors Rb, and coupling capacitors Cc. Transistor M5p may have a source terminal coupled to positive power supply line 82, a drain terminal coupled to injection node 85, and a gate terminal. First coupling capacitor Cc may have a first terminal coupled to amplifier input terminal In+ and a second terminal coupled to the gate of transistor M5p. First bias resistor Rb may have a first terminal coupled to the gate of transistor M5p and a second terminal configured to receive bias voltage IM2_bias.

Similarly, transistor M6p may have a source terminal coupled to positive power supply line 82, a drain terminal coupled to injection node 85, and a gate terminal. Second coupling capacitor Cc may have a first terminal coupled to amplifier input terminal In− and a second terminal coupled to the gate of transistor M6p. Coupling capacitors Cc are used pass through AC (alternating-current) signals while blocking DC (direct-current) signals from the differential input port of the amplifier circuitry 50. Second bias resistor Rb may have a first terminal coupled to the gate of transistor M6p and a second terminal configured to receive bias voltage IM2_bias. Configured in this way, IM2 generation circuit 72 may produce an IM2 current signal that flows into the center tap of secondary inductor 84b. The IM2 current signal can be converted into a voltage signal at node 85 using active inductor load 86. Bias voltage IM2_bias received by resistors Rb may be generated using bias voltage generator 90 of the type shown in FIG. 6 (as an example).

The embodiments of FIG. 5 in which IM2 generation circuit 72 includes n-type transistors and of FIG. 8 in which IM2 generation circuit 72 includes p-type transistors are merely illustrative. As another example, IM2 generation circuit 72 may include both n-type and p-type transistors. As another example, IM2 generation circuit 72 may include more than two transistors, three or more transistors, four or more transistors, four to ten transistors, or more than ten transistors. As another example, IM2 generation circuit 72 may include any number of passive biasing and/or coupling components (e.g., resistors, capacitors, inductors, etc.). As another example, IM2 generation circuit 72 can be directly coupled to the gate terminals of input transistors M1 and M2, to the secondary inductor 84b, to the primary inductor 84a, to the node(s) between the input transistors and the cascode transistors, or to another node within circuitry 50.

Figure 9:
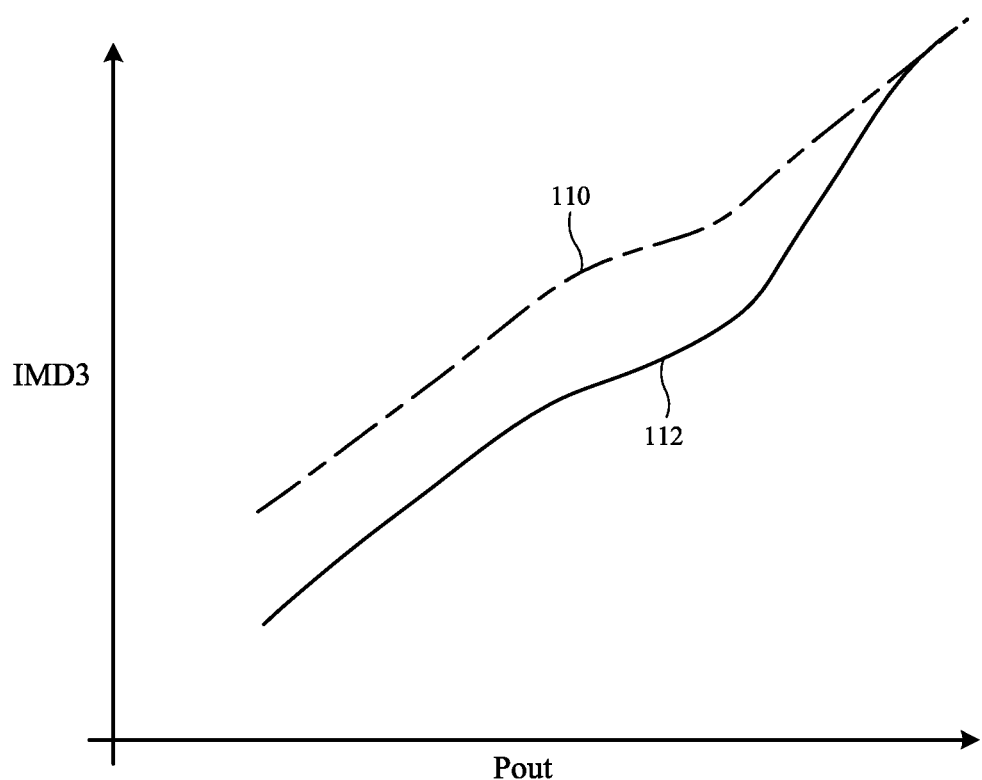
FIG. 9 is a diagram illustrating a reduction in $3^{rd}$ order intermodulation distortion (IMD3) in accordance with some embodiments.

FIG. 9 is a diagram illustrating a reduction in $3^{rd}$ order intermodulation distortion (IMD3) that can be achieved in accordance with some embodiments. Curve 110 represents the IMD3 profile without any IM2 injection, whereas curve 112 represents the IMD3 profile with IM2 injection (e.g., with IM2 tones generated using circuit 72 of FIG. 5 or FIG. 8). As shown in FIG. 9, circuitry 50 with IM2 injection to cancel out or mitigate the undesired IM3 tones can dramatically reduce the overall 3$^{rd}$ order intermodulation distortion of the radio-frequency power amplifier across a wide range of output power levels. This can help enhance the linearity of the power amplifier circuitry without negatively impacting the overall efficiency.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Radio-frequency power amplifier circuitry comprising:
    a first input transistor having a first source-drain terminal coupled to a ground power supply line, a second source-drain terminal coupled to a first amplifier output terminal, and a gate terminal;
    a second input transistor having a first source-drain terminal coupled to the ground power supply line, a second source-drain terminal coupled to a second amplifier output terminal, and a gate terminal;
    an input transformer configured to receive a radio-frequency signal and coupled to the gate terminals of the first and second input transistors; and
    a second order intermodulation generation circuit having an output coupled to the input transformer.

2. The radio-frequency power amplifier circuitry of claim 1, wherein the input transformer comprises:
    a primary inductor having first and second terminals configured to receive the radio-frequency signal; and
    a secondary inductor having a first terminal coupled to the gate terminal of the first input transistor and having a second terminal coupled to the gate terminal of the second input transistor.

3. The radio-frequency power amplifier circuitry of claim 2, further comprising:
    a first cascode transistor having a first source-drain terminal coupled to the second source-drain terminal of the first input transistor, a second source-drain terminal coupled to the first amplifier output terminal, and a gate terminal configured to receive a cascode bias voltage; and
    a second cascode transistor having a first source-drain terminal coupled to the second source-drain terminal of the second input transistor, a second source-drain terminal coupled to the second amplifier output terminal, and a gate terminal configured to receive the cascode bias voltage.

4. The radio-frequency power amplifier circuitry of claim 2, further comprising:
    an active inductor load circuit coupled to a center tap of the secondary inductor.

5. The radio-frequency power amplifier circuitry of claim 4, wherein the active inductor load circuit comprises:
    a load transistor having a first source-drain terminal coupled to the center tap of the secondary inductor, a second source-drain terminal coupled to the ground power supply line, and a gate terminal;
    a resistor having a first terminal coupled to the first source-drain terminal of the load transistor and having a second terminal coupled to the gate terminal of the load transistor; and
    a capacitor having a first terminal coupled to the gate terminal of the load transistor and having a second terminal coupled to the ground power supply line.

6. The radio-frequency power amplifier circuitry of claim 2, wherein the second order intermodulation generation circuit comprises:
    a first n-type transistor having a first source-drain terminal coupled to the gate terminal of the first input transistor, a second source-drain terminal coupled to a positive power supply line, and a gate terminal configured to receive a bias voltage/.

7. The radio-frequency power amplifier circuitry of claim 6, wherein the second order intermodulation generation circuit further comprises:
    a second n-type transistor having a first source-drain terminal coupled to the gate terminal of the second input transistor, a second source-drain terminal coupled to the positive power supply line, and a gate terminal configured to receive the bias voltage.

8. The radio-frequency power amplifier circuitry of claim 2, wherein the second order intermodulation generation circuit comprises:
    a first p-type transistor having a first source-drain terminal coupled to a center tap of the secondary inductor, a second source-drain terminal coupled to a positive power supply line, and a gate terminal configured to receive a bias voltage via a first bias resistor; and
    a second p-type transistor having a first source-drain terminal coupled to the center tap of the secondary inductor, a second source-drain terminal coupled to the positive power supply line, and a gate terminal configured to receive the bias voltage via a second bias resistor.

9. The radio-frequency power amplifier circuitry of claim 8, wherein the second order intermodulation generation circuit further comprises:
    a first capacitor having a first terminal coupled to the gate terminal of the first p-type transistor and having a second terminal coupled to the first terminal of the primary inductor; and
    a second capacitor having a first terminal coupled to the gate terminal of the second p-type transistor and having a second terminal coupled to the second terminal of the primary inductor.

10. The radio-frequency power amplifier circuitry of claim 8, further comprising:
    a bias voltage generation circuit that includes
        a bias diode,
        an operational amplifier configured to receive a voltage from the bias diode and to output the bias voltage, a first additional transistor having a gate terminal configured to receive the bias voltage from the operational amplifier, a second additional transistor coupled in series with the first additional transistor, a resistor having a first terminal coupled to a first source-drain terminal of the second additional transistor and having a second terminal coupled to the gate terminal of the second additional transistor, and a capacitor having a first terminal coupled to the gate terminal of the second additional transistor and having a second terminal coupled to the ground power supply line.

11. A method of operating wireless circuitry, comprising:

receiving a radio-frequency signal at an input transformer;

receiving, at an amplifier, the radio-frequency signal from the input transformer;

generating a second order intermodulation signal using a second order intermodulation generation circuit and coupling the second order intermodulation signal to the input transformer; and combining the second order intermodulation signal with the radio-frequency signal to generate corresponding signals that cancel out third order intermodulation signals associated with the amplifier.

12. The method of claim 11, further comprising:

converting the second order intermodulation signal from a current signal to a voltage signal using an active inductor load circuit coupled to the input transformer.

13. The method of claim 11, wherein the amplifier includes first and second input transistors, and wherein generating the second order intermodulation signal comprises:

using a first n-type transistor having a source terminal coupled to a gate terminal of the first input transistor to output a second order intermodulation current through a secondary inductor in the input transformer; and using a second n-type transistor having a source terminal coupled to a gate terminal of the second input transistor to output the second order intermodulation current through the secondary inductor in the input transformer.

14. The method of claim 13, further comprising:

providing a bias voltage to gate terminals of the first and second n-type transistors.

15. The method of claim 11, wherein the input transformer includes a primary inductor configured to receive the radio-frequency signal and includes a secondary inductor, and wherein generating the second order intermodulation signal comprises:

using a first p-type transistor to output a second order intermodulation current to a center tap of the secondary inductor; and using a second p-type transistor to output the second order intermodulation current to the center tap of the secondary inductor.

16. The method of claim 15, further comprising:

coupling a first terminal of the primary inductor to a gate terminal of the first p-type transistor via a first capacitor; and coupling a second terminal of the primary inductor to a gate terminal of the second p-type transistor via a second capacitor.

17. An electronic device comprising:

one or more processors configured to generate transmit signals;

a transceiver configured to generate radio-frequency signals based on the transmit signals; and power amplifier circuitry configured to amplify the radio-frequency signals for wireless transmission by an antenna, the power amplifier circuitry having a first input transistor having a source terminal coupled to a ground power supply line, a drain terminal coupled to a first amplifier output terminal, and a gate terminal, a second input transistor having a source terminal coupled to the ground power supply line, a drain terminal coupled to a second amplifier output terminal, and a gate terminal, an input transformer configured to receive the radio-frequency signals and coupled to the gate terminals of the first and second input transistors, and a second order intermodulation generation circuit coupled to the input transformer and configured to generate second order intermodulation signals that are used to generate third order intermodulation cancelling signals.

18. The electronic device of claim 17, wherein the input transformer comprises:

a primary coil having first and second terminals configured to receive the radio-frequency signals; and a secondary coil having a first terminal coupled to the gate terminal of the first input transistor and having a second terminal coupled to the gate terminal of the second input transistor.

19. The electronic device of claim 18, wherein the second order intermodulation generation circuit comprises:

a first n-type transistor having a source terminal coupled to the gate terminal of the first input transistor, a drain terminal coupled to a positive power supply line, and a gate terminal configured to receive a bias voltage; and a second n-type transistor having a source terminal coupled to the gate terminal of the second input transistor, a drain terminal coupled to the positive power supply line, and a gate terminal configured to receive the bias voltage.

20. The electronic device of claim 18, wherein the second order intermodulation generation circuit comprises:

a first p-type transistor having a drain terminal coupled to a center tap of the secondary coil, a source terminal coupled to a positive power supply line, and a gate terminal configured to receive a bias voltage; and a second p-type transistor having a drain terminal coupled to the center tap of the secondary coil, a source terminal coupled to the positive power supply line, and a gate terminal configured to receive the bias voltage.

* * * * *

UNITED STATES PATENT AND TRADEMARK OFFICE
CERTIFICATE OF CORRECTION

| | | |
|---|---|---|
| PATENT NO. | : 12,119,796 B2 | |
| APPLICATION NO. | : 17/539977 | |
| DATED | : October 15, 2024 | |
| INVENTOR(S) | : Nitesh Singhal | |

It is certified that error appears in the above-identified patent and that said Letters Patent is hereby corrected as shown below:

In the Claims

Column 16, Line 28, "voltage/." should read -- voltage. --

Signed and Sealed this
Third Day of December, 2024

Katherine Kelly Vidal
Director of the United States Patent and Trademark Office